(12) United States Patent
Domoto et al.

(10) Patent No.: US 10,151,045 B2
(45) Date of Patent: *Dec. 11, 2018

(54) METHOD FOR PRODUCING CRYSTAL

(71) Applicant: KYOCERA Corporation, Kyoto-shi, Kyoto (JP)

(72) Inventors: Chiaki Domoto, Kyoto (JP); Katsuaki Masaki, Kyoto (JP); Yutaka Kuba, Kyoto (JP); Daisuke Ueyama, Kyoto (JP); Kouji Miyamoto, Kyoto (JP); Yuuichiro Hayashi, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/649,396

(22) Filed: Jul. 13, 2017

(65) Prior Publication Data

US 2017/0342592 A1 Nov. 30, 2017

Related U.S. Application Data

(63) Continuation of application No. 14/354,410, filed as application No. PCT/JP2012/077915 on Oct. 29, 2012, now Pat. No. 9,777,396.

(30) Foreign Application Priority Data

Oct. 28, 2011 (JP) .................................. 2011-237585
Dec. 28, 2011 (JP) .................................. 2011-287468
Jun. 28, 2012 (JP) .................................. 2012-145479

(51) Int. Cl.
 *C30B 15/30* (2006.01)
 *C30B 19/04* (2006.01)
(Continued)

(52) U.S. Cl.
 CPC .............. *C30B 15/30* (2013.01); *C30B 15/10* (2013.01); *C30B 19/04* (2013.01); *C30B 29/36* (2013.01)

(58) Field of Classification Search
 CPC combination set(s) only.
 See application file for complete search history.

(56) References Cited

U.S. PATENT DOCUMENTS

2003/0084840 A1  5/2003  Todt et al.
2005/0183657 A1  8/2005  Kusunoki et al.
2007/0209573 A1  9/2007  Kusunoki et al.

FOREIGN PATENT DOCUMENTS

JP  2000-264790 A  9/2000
JP  2004-002173 A  1/2004
(Continued)

OTHER PUBLICATIONS

International Search Report, PCT/JP2012/077915, dated Nov. 22, 2012, 2 pgs.
(Continued)

*Primary Examiner* — Erin F Bergner
(74) *Attorney, Agent, or Firm* — Volpe and Koenig, P.C.

(57) ABSTRACT

A method for producing a crystal, according to the present invention, where the lower surface 4B of a seed crystal 4 which is rotatably arranged and made of silicon carbide is brought into contact with a solution 5 of silicon solvent containing carbon in a crucible 6 which is rotatably arranged and the seed crystal 4 is pulled up and a crystal of silicon carbide is grown from the solution 5 on the lower surface 4B of the seed crystal 4, comprising the steps of bringing the lower surface 4B of the seed crystal 4 into contact with the solution 5 in a contact step, rotating the seed crystal 4 in a seed crystal rotation step, rotating the crucible 6 in a crucible rotation step, and stopping rotation of the crucible 6, while
(Continued)

the seed crystal 4 is rotated in the state in which the lower surface 4B of the seed crystal 4 is in contact with the solution 5, in a deceleration step.

6 Claims, 11 Drawing Sheets

(51) Int. Cl.
  *C30B 29/36* (2006.01)
  *C30B 15/10* (2006.01)

(56) References Cited

FOREIGN PATENT DOCUMENTS

| | | |
|---|---|---|
| JP | 2006-117441 A | 5/2006 |
| JP | 2009-091222 A | 4/2009 |
| JP | 2009-091225 A | 4/2009 |
| JP | 2010-208926 A | 9/2010 |
| WO | 2010/103387 A1 | 9/2010 |

OTHER PUBLICATIONS

Japanese Office Action with English concise explanation, Japanese Patent Application No. 2016-124063, dated Jul. 18, 2017, 6 pgs.

(a)

(b)

(a)

D5 ⟷ D6

(b)

(a)

(b)

METHOD FOR PRODUCING CRYSTAL

CROSS-REFERENCES TO RELATED APPLICATIONS

This application is a Divisional of U.S. patent application Ser. No. 14/354,410, filed on Apr. 25, 2014, which claims priority to JP Patent Application No. 2011-237585 filed on Oct. 28, 2011, to JP Patent Application No. 2011-287468 filed on Dec. 28, 2011, to JP Patent Application No. 2012-145479 filed on Jun. 28, 2012 and to PCT/JP2012/077915 filed on Oct. 29, 2012, which are included by reference in their entirety for all purposes.

TECHNICAL FIELD

The present invention relates to a method for producing a crystal to produce a crystal of silicon carbide.

BACKGROUND ART

At present, silicon carbide (SiC) which is a compound of carbon and silicon has attracted attention as a crystal. Silicon carbide has attracted attention because of various advantages that, for example, the band gap is large as compared with the band gap of silicon and the electric field strength at dielectric breakdown is large (good withstand voltage characteristics), the thermal conductivity is high, the heat resistance is high, the chemical resistance is good, and the radiation resistance is good. A crystal of this silicon carbide is going to be applied to fields of, for example, heavy electric equipment including nuclear energy, transportation including automobile and aviation, home electrical appliance, and space. For example, Japanese Unexamined Patent Application Publication No. 2000-264790 discloses that a single crystal of silicon carbide is produced by a solution growth method.

SUMMARY OF INVENTION

In the research and development in which a crystal made of silicon carbide is produced by a solution growth method, it is difficult to generate an upward flow toward a seed crystal in a solution arranged in a crucible to grow high-quality silicon carbide. The present invention has been devised in consideration of such circumstances and it is an object to provide a method for producing a crystal, where high-quality silicon carbide can be grown.

A method for producing a crystal, according to an embodiment of the present invention, where the lower surface of a seed crystal which is rotatably arranged and made of silicon carbide is brought into contact with a solution of silicon solvent containing carbon in a crucible which is rotatably arranged and the above-described seed crystal is pulled up and a crystal of silicon carbide is grown from the above-described solution on the above-described lower surface of the above-described seed crystal, includes the steps of bringing the above-described lower surface of the above-described seed crystal into contact with the above-described solution in a contact step, rotating the above-described seed crystal in a seed crystal rotation step, rotating the above-described crucible in a crucible rotation step, and decelerating rotation of the above-described crucible and, thereafter, decelerating rotation of the above-described seed crystal, while the above-described lower surface of the above-described seed crystal is in contact with the above-described solution, in a deceleration step.

According to the method for producing a crystal of the present invention, rotation of the seed crystal is decelerated after rotation of the crucible is decelerated, so that an upward flow toward the seed crystal can be generated easily in the solution. As a result, carbon in the solution is carried to the vicinity of the lower surface of the seed crystal easily and, thereby, a crystal of high-quality silicon carbide can be grown.

DESCRIPTION OF EMBODIMENTS

<Crystal Production Apparatus>

Figure 1:
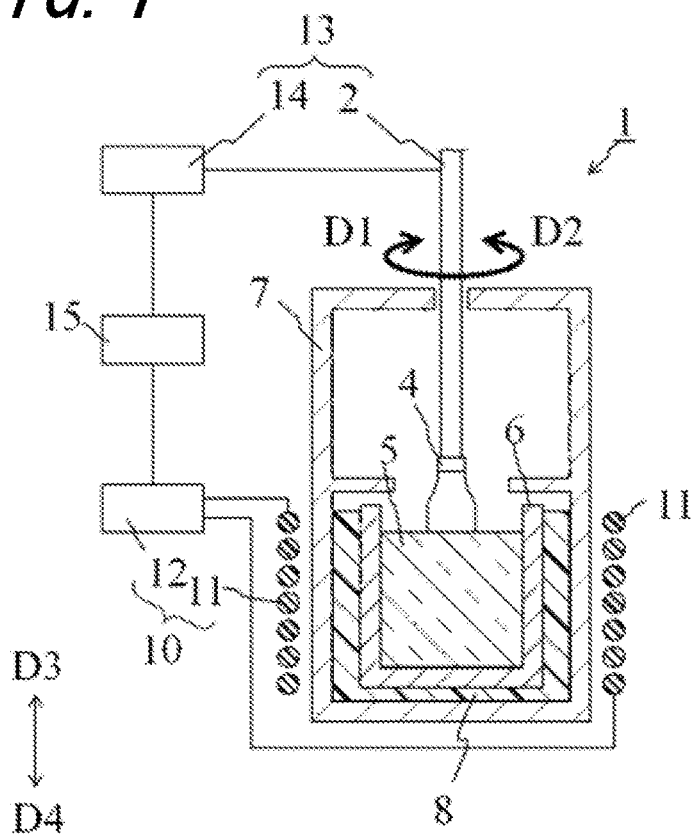
FIG. 1 is a sectional view showing an example of a crystal production apparatus used in a method for producing a crystal, according to the present invention.

Examples of a crystal production apparatus used in a method for producing a crystal, according to the present invention, will be described with reference to drawings. A crystal production apparatus 1 is mainly formed from a holding member 2, an adhesive 3, a seed crystal 4, and a solution 5. The outline of the crystal production apparatus 1 will be described below with reference to FIG. 1.

A crucible 6 is disposed in a crucible container 7. The crucible container 7 has a function of holding the crucible 6. A heat insulating material 8 is disposed between the crucible container 7 and the crucible 6. This heat insulating material 8 surrounds the crucible 6. The heat insulating material 8 contributes to suppression of heat dissipation from the crucible 6 and stable keeping of the temperature of the crucible 6.

The crucible 6 has a function of a vessel to melt, in the inside, a raw material for a silicon carbide single crystal to be grown. In the present example, the raw material (carbon and silicon) of the single crystal is melted and is stored as the solution 5 in the crucible 6. In the present example, a solution growth method is adopted, and a crystal is grown by establishing a thermal equilibrium state in this crucible 6.

As for the crucible 6, start of rotation, acceleration of rotation, deceleration of rotation, and stop of rotation are possible. As for rotation of the crucible 6, only the crucible 6 may be rotated, the crucible 6 and the heat insulating material 8 may be rotated, or the crucible 6, the heat insulating material 8, and the crucible container 7 may be rotated. The crucible 6 is rotated in the D1 direction (clockwise) or the D2 direction (counterclockwise), when viewed from the D3 direction. The crucible 6 may be rotated in such a way that, for example, the barycenter of the crucible 6 serves as the center of rotation. The crucible 6 may be rotated in such a way that the number of revolutions becomes, for example, 500 rpm or less.

Heat is applied to the crucible 6 by a heating mechanism 10. An electromagnetic heating system in which the crucible 6 is heated by an electromagnetic wave is adopted for the heating mechanism 10 of the present example. The heating mechanism 10 is formed from a coil 11 and an alternating current power supply 12. The crucible 6 is made from, for example, carbon (graphite).

The solution 5 is arranged in the crucible 6. In the solution 5, the solvent is silicon and the solute is carbon. The solubility of an element serving as the solute increases as the temperature of an element serving as the solvent increases.

On the other hand, if the solution 5 in which the solute is dissolved into the solvent at a high temperature is cooled, the solute more dissolved than the solubility is precipitated. In the solution growth method adopted in the present example, a crystal is grown on the lower surface 4B of the seed crystal 4 taking advantage of precipitation on the basis of the thermal equilibrium. The temperature of the solution 5 can be set at, for example, 1,300° C. or higher and 2,500° C. or lower.

The solution 5 is prepared by putting the raw material for silicon (for example, the raw material for silicon is granules) and a raw material for carbon (for example, raw material for carbon is granules) into the crucible 6 and heating the raw material for silicon to melt the raw material for silicon. As for the heating temperature of the crucible 6, a temperature at which the raw material for silicon is melted may be used and, for example, 1,450° C. or higher and 1,800° C. or lower can be employed. Alternatively, the solution 5 may be prepared by melting the raw material for silicon in the crucible 6 and putting the raw material for carbon therein. Meanwhile, in the case where the crucible 6 is made from carbon, the solution 5 containing carbon can also be prepared by putting the raw material for silicon into the inside and performing melting to dissolve the inside wall surface of the crucible 6.

In the present example, the crucible 6 is heated as described below. Initially, a current is passed through the coil 11 by using the alternating current power supply 12 to generate an electromagnetic field in a space including the heat insulating material 8. Then, an induced current passes through the crucible 6 on the basis of this electromagnetic field. The induced current passing the crucible 6 is converted to thermal energy because of various losses, e.g., Joule heat generation based on electric resistance and heat generation based on hysteresis loss. That is, the crucible 6 is heated because of a heat loss of the induced current. Also, an induced current may be passed through the solution 5 in itself by this electromagnetic field to cause heat generation. In the case where the solution 5 in itself is allowed to generate heat, as described above, it is not necessary that the crucible 6 in itself be allowed to generate heat.

In the present example, the electromagnetic heating system is adopted as the heating mechanism 10, although heating may be performed by using other systems. As for the heating mechanism 10, other systems, for example, a system in which the heat generated from a heating resistor, e.g., carbon, is transferred can be adopted. In the case where this heat transfer system is adopted, the heating resistor is arranged (between the crucible 6 and the heat insulating material 8).

The seed crystal 4 is brought into contact with the solution 5 by a transfer mechanism 13. The transfer mechanism 13 has also a function of carrying out a crystal grown on the lower surface 4B of the seed crystal 4. The transfer mechanism 13 is formed from the holding member 2, a power source 14, and the like. The seed crystal 4 and the crystal grown on the lower surface 4B of the seed crystal 4 are carried in and out by this holding member 2. The seed crystal 4 is attached to a lower end surface 2A of the holding member 2, and the movement of this holding member 2 in the vertical (D3, D4) direction is controlled by the power source 14. In the present example, the D4 direction refers to the downward direction in a physical space, and the D3 direction refers to the upward direction in a physical space.

Figure 2:
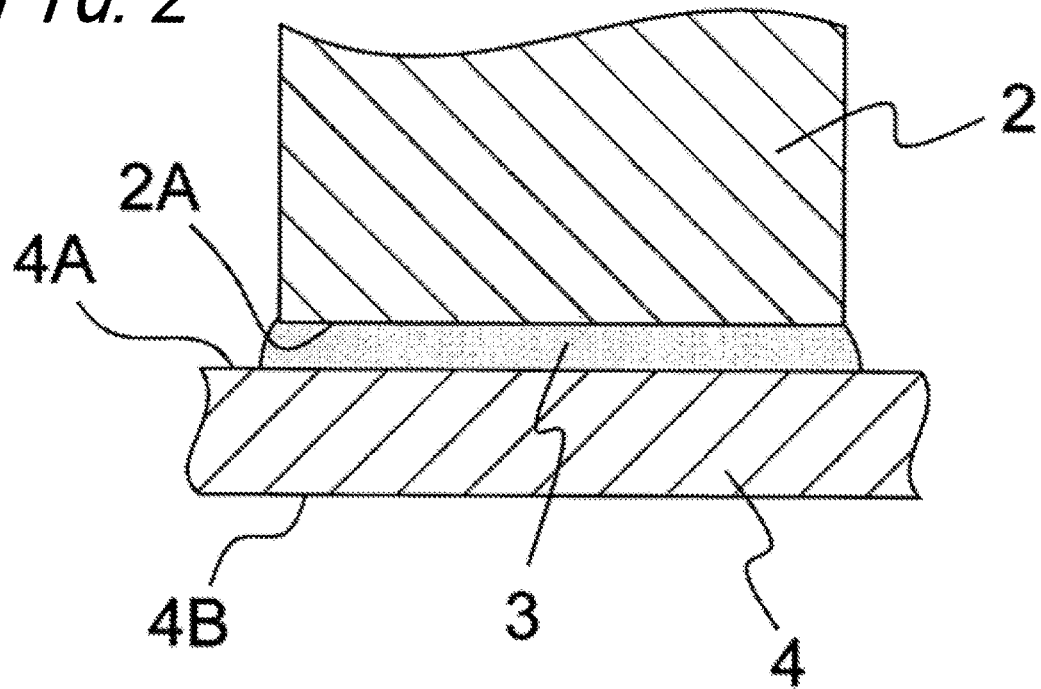
FIG. 2 is a magnified sectional view of a portion including a seed crystal, an adhesive, and a holding member in the crystal production apparatus shown in FIG. 1.

As shown in FIG. 2, the seed crystal 4 is fixed to the lower end surface 2A of the holding member 2 with the adhesive 3 therebetween. It is enough that the holding member 2 has the lower end surface 2A. The shape of the lower end surface 2A when viewed in plan is, for example, a polygonal shape, e.g., a tetragonal shape, or a circular shape. The three-dimensional shape of the holding member 2 is a bar, a rectangular parallelepiped, or the like.

The area of the lower end surface 2A may be either larger than the area of the upper surface 4A of the seed crystal 4 or smaller than the area of the upper surface 4A. In the present example, the area of the lower end surface 2A is smaller than the area of the upper surface 4A of the seed crystal 4. In the case where the area of the lower end surface 2A of the holding member 2 is larger than or equal to the area of the upper surface 4A of the seed crystal 4, the whole upper surface 4A of the seed crystal 4 can be fixed interposing the adhesive 3. Consequently, peeling of the seed crystal 4 from the holding member 2 can be further suppressed.

Meanwhile, the holding member 2 is made from carbon. It is enough that the holding member 2 is made from a material containing carbon as a primary component. The holding member 2 is made from a polycrystal of carbon, a sintered body of carbon, or the like.

As for the holding member 2, start of rotation, acceleration of rotation, deceleration of rotation, and stop of rotation are possible. The seed crystal 4 fixed to the lower end surface 2A of the holding member 2 is rotated or stopped by the holding member 2 being rotated or stopped. The seed crystal 4 is rotated in the D1 and D2 directions. The seed crystal 4 is rotated in such a way that, for example, the barycenter when viewed in plan is in the vicinity of the center of rotation. The seed crystal 4 can be rotated clockwise or counterclockwise when viewed in plan from the D3 direction. The seed crystal 4 may be rotated clockwise or counterclockwise in such a way that the number of revolutions becomes, for example, 500 rpm or less.

The coil 11 is formed of a conductor and is wound around the circumference of the crucible 6. The alternating current power supply 12 is to pass an alternating current through the coil 11, and the heating time of the inside of the crucible 6 to a predetermined temperature can be reduced by employing an alternating current with a high frequency.

In the crystal production apparatus 1, the alternating current power supply 12 of the heating mechanism 10 and the power source 14 of the transfer mechanism 13 are connected to a control portion 15 and are controlled by control portion 15. That is, in the crystal production apparatus 1, heating and temperature control of the solution 5 and carrying in and out of the seed crystal 4 are ganged and controlled by the control portion 15. The control portion 15 includes a central processing unit and a storage device, e.g., memory, and is formed from a known computer, for example.

<Method for Producing Crystal>

A method for producing a crystal, according to an embodiment of the present invention, will be described. The method for producing a crystal, according to the present embodiment, includes a step to bring the lower surface 4B of the seed crystal 4 into contact with the solution 5 (contact step), a step to rotate the seed crystal 4 (seed crystal rotation step), a step to rotate the crucible 6 (crucible rotation step), and a step to decelerate rotation of the crucible 6 and, thereafter, decelerate rotation of the seed crystal 4 while the lower surface 4B of the seed crystal 4 is in contact with the solution 5 (crucible stop step).

Figure 3:
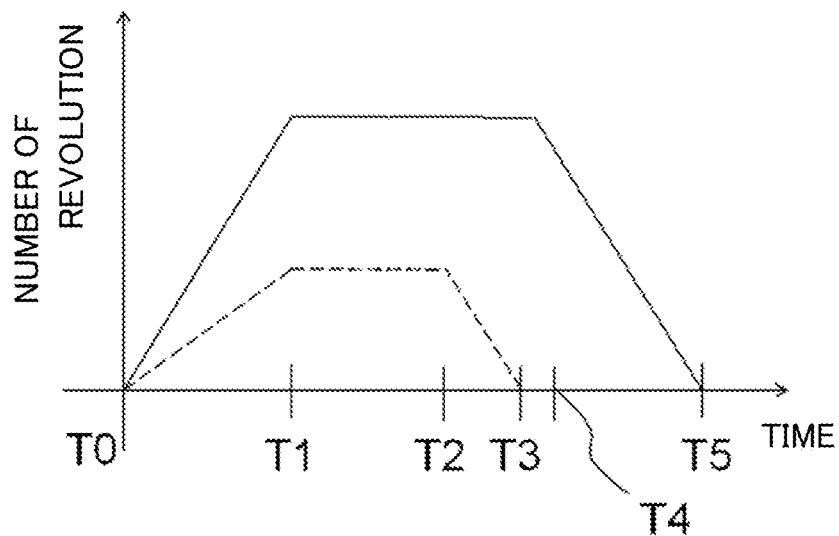
FIG. 3 is a diagram showing a rotation profile of a crucible and a seed crystal in a method for producing a crystal, according to an embodiment of the present invention.

A crystal made of silicon carbide can be produced by the crystal production apparatus 1. The crystal production apparatus 1 includes mainly the crucible 6, the crucible container 7, the heating mechanism 10, the transfer mechanism 13, and the control portion 15. In the crystal production apparatus 1, a crystal is grown by using a solution growth method. In this regard, FIG. 3 shows an outline of rotations of the crucible 6 and the seed crystal 4. The vertical axis indicates the number of revolutions (rpm) and the horizontal axis indicates the elapsed time. A broken line indicates changes in the number of revolutions of the crucible 6 with time, and a solid line indicates changes in the number of revolutions of the seed crystal 4 with time. Also, T0 to T5 indicate elapsed times.

(Step to Bring Lower Surface of Seed Crystal into Contact with Solution)

The holding member 2 is moved downward and, thereby, the lower surface 4B of the seed crystal 4 fixed to the lower end surface 2A of the holding member 2 is brought into contact with the solution 5. It is enough that at least the lower surface 4B of the seed crystal 4 is in contact with the solution 5. Specifically, the whole seed crystal 4 may be immersed in the solution 5, part of the seed crystal 4 may be immersed in the solution 5, or only the lower surface 4B of the seed crystal 4 may be in contact with the solution 5.

The temperature of the solution 5 is lowered in the vicinity of the lower surface 4B of the seed crystal 4 by bringing the lower surface 4B of the seed crystal 4 into contact with the solution 5, and a crystal of silicon carbide is precipitated on the lower surface 4B of the seed crystal 4 where thermal equilibrium corresponds to a border line. That is, a crystal is grown on the lower surface 4B of the seed crystal 4 taking advantage of precipitation of a crystal on the basis of thermal equilibrium.

After a crystal has begun to grow on the lower surface 4B of the seed crystal 4, the holding member 2 is pulled upward gradually. The crystal of silicon carbide grown on the lower surface 4B of the seed crystal 4 can be continuously grown in the thickness direction by pulling the holding member 2 upward. In that case as well, it is necessary that the lower surface 4B of the seed crystal 4 be in contact with at least the solution 5. In this regard, in the case where the crystal is grown on the lower surface 4B of the seed crystal 4, it is enough that the lowest end of the crystal is in contact with the solution 5. Here, the term "the lower surface 4B of the seed crystal 4" includes the lowest end of the crystal grown on the lower surface 4B of the seed crystal 4.

(Step to Rotate Seed Crystal)

Rotation of the seed crystal 4 is started. For example, the number of revolutions is increased in a predetermined time and the rotation of the seed crystal 4 is brought into a steady rotation state in which a predetermined number of revolutions is maintained. The rotation direction of the seed crystal 4 can be set to become clockwise or counterclockwise. In the present embodiment, the seed crystal 4 is rotated clockwise and, as shown in FIG. 3, the rotation is brought into a steady rotation state at T1. In this regard, in FIG. 3, the positive direction of the number of revolutions is specified to be clockwise and the negative direction of the number of revolutions is specified to be counterclockwise.

(Step to Rotate Crucible)

Rotation of the crucible 6 is started. For example, the number of revolutions is increased in a predetermined time and the rotation of the crucible 6 is brought into a steady rotation state in which a predetermined number of revolutions is maintained. In the present embodiment, the crucible 6 is rotated clockwise and, as shown in FIG. 3, the rotation is brought into a steady rotation state at T1. In this regard, in the present embodiment, the seed crystal 4 and the crucible 6 are set to come into the steady rotation states at T1 at the same time. However, the steady rotation states may not be reached at the same time.

The number of revolutions of the crucible 6 in the steady rotation state can be set to become smaller than, for example, the number of revolutions of the seed crystal 4 in the steady rotation state. In the steady rotation states, for example, scattering of the solution 5 outward from the crucible 6 because of a centrifugal force can be suppressed by allowing the number of revolutions of the crucible 6 to become smaller than the number of revolutions of the seed crystal 4.

The rotation direction of the crucible 6 can be set to become clockwise or counterclockwise. The rotation direction of the crucible 6 can be set to become, for example, the same rotation direction as that of the seed crystal 4. In the case where the crucible 6 and the seed crystal 4 are rotated in the same rotation direction, in the vicinity of the liquid surface of the solution 5, the centrifugal force generated by the rotation of the seed crystal 4 can be enhanced, and upward convection generated in the solution 5 can be enhanced.

On the other hand, the rotation direction of the crucible 6 can be set to become the direction reverse to the rotation direction of the seed crystal 4. In this case, the whole solution 5 is mixed easily and, therefore, variations in concentration distribution of carbon or silicon in the solution 5 can be suppressed. As a result, generation of dislocation or micropipe of the crystal grown on the lower surface 4B can be suppressed and the quality of the crystal can be improved.

The above-described contact step, seed crystal rotation step, and crucible rotation step may be performed in any order. That is, in the case where the contact step is performed before the seed crystal rotation step and the crucible rotation step, the height positions of the seed crystal 4 and the crucible 6 can be adjusted in the state in which the seed crystal 4 and the crucible 6 are stopped. Consequently, the height position of the lower surface 4B of the seed crystal 4 relative to the solution 5 can be controlled easily.

(Step to Decelerate Rotation of Crucible)

Rotation of the crucible 6 is decelerated and, thereafter, rotation of the seed crystal 4 is decelerated while the lower surface 4B of the seed crystal 4 is in contact with the solution 5. That is, as shown in FIG. 3, deceleration of the crucible 6 is started before rotation of the seed crystal 4 is decelerated. The crucible 6 may be decelerated in such a way that the number of revolutions is reduced gradually. The crucible 6 is decelerated at a steady rate in such a way that a specific number of revolutions is reduced in a predetermined time.

When the crucible 6 is stopped, it is enough that the seed crystal 4 is rotated. For example, the crucible 6 is decelerated, and after the rotation of the crucible 6 is stopped, rotation of the seed crystal 4 is stopped. The seed crystal 4 may be decelerated in such a way that the number of revolutions is gradually reduced in a predetermined time as with deceleration of the crucible 6.

Figure 4:
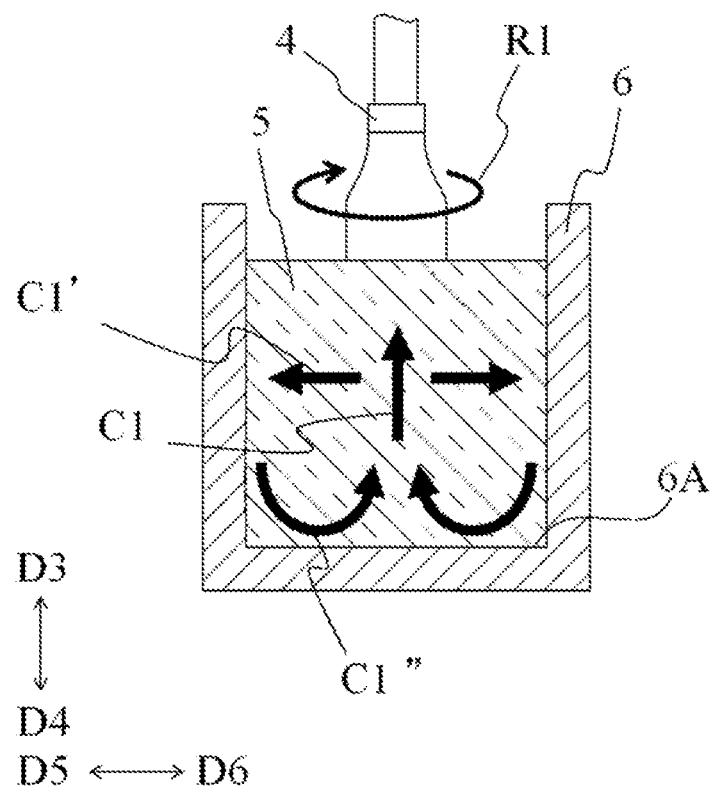
FIG. 4 is a schematic diagram showing a flow in a solution in a method for producing a crystal, according to an embodiment of the present invention, and is a magnified sectional view of the vicinity of a crucible and a seed crystal in the crystal production apparatus shown in FIG. 1.

In the present embodiment, rotation of the crucible 6 is decelerated while the seed crystal 4 is rotated. As shown in FIG. 4, an upward convection C1 which moves away from the bottom 6A of the crucible 6 toward the lower surface 4B of the seed crystal 4 can be generated easily in the solution 5 in the crucible 6 by reducing the number of revolutions of the crucible 6. The reason for easy generation of the upward convection C1 will be described below.

When the number of revolutions of the crucible 6 is reduced, the solution 5 located in the vicinity of the bottom 6A of the crucible 6 is decelerated because of the friction against the bottom 6A. The flow rate of the convection C1" in the vicinity of the bottom 6A becomes small as compared with the flow rate of the convection C1' in the upper portion of the crucible 6 because of the deceleration of the solution 5 located in the vicinity of the bottom 6A of the crucible 6. The upward convection C1 which flows upward from the vicinity of the bottom of the crucible 6 can be generated easily by the above-described convection C1' and convection C1".

Figure 5:
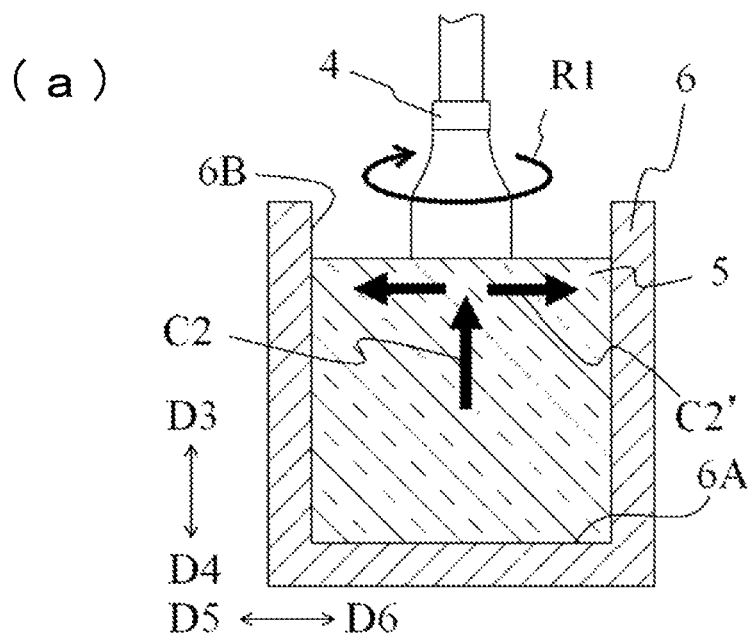
FIG. 5 is a schematic diagram showing a flow in a solution in a method for producing a crystal, according to an embodiment of the present invention, (a) is a magnified sectional view of the vicinity of the crucible and the seed crystal in the crystal production apparatus shown in FIG. 1, and (b) is a plan view of the crucible and the solution when viewed from above.
Figure 5:
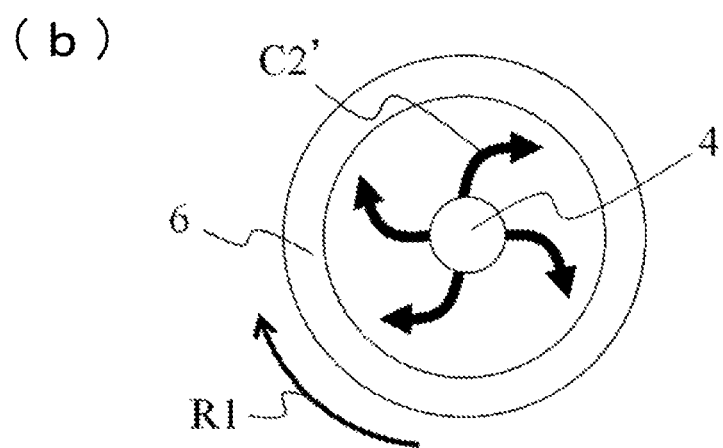

On the other hand, the seed crystal 4 is rotated while being in contact with the solution 5. As shown in FIG. 5, a centrifugal force is applied to the vicinity of the surface of the solution 5 because the seed crystal 4 is rotated while being in contact with the solution 5, and a convection C2' is generated easily along the same direction as the rotation direction R1 of the seed crystal 4. As a result, the convection C2 which moves upward from the vicinity of the bottom of the crucible 6 is generated because of the rotation of the seed crystal 4.

The convection C2 generated because of the rotation of the seed crystal 4, as described above, amplifies the convection C1 generated because of deceleration of the crucible 6. As a result, an upward convection C3 which moves toward the lower surface 4B of the seed crystal 4, as shown in FIG. 6, can be generated.

In the case where the upward convection C3 which moves toward the lower surface 4B of the seed crystal 4 is generated, carbon is supplied to the vicinity of the lower surface 4B of the seed crystal 4 easily. Consequently, a high-quality silicon carbide crystal can be grown on the lower surface 4B of the seed crystal 4. Also, carbon is supplied to the vicinity of the lower surface 4B of the seed crystal 4 easily and, thereby, the vicinity of the lower surface 4B comes into the state of being rich in carbon and silicon, so that the crystal growth rate can be improved.

Figure 6:
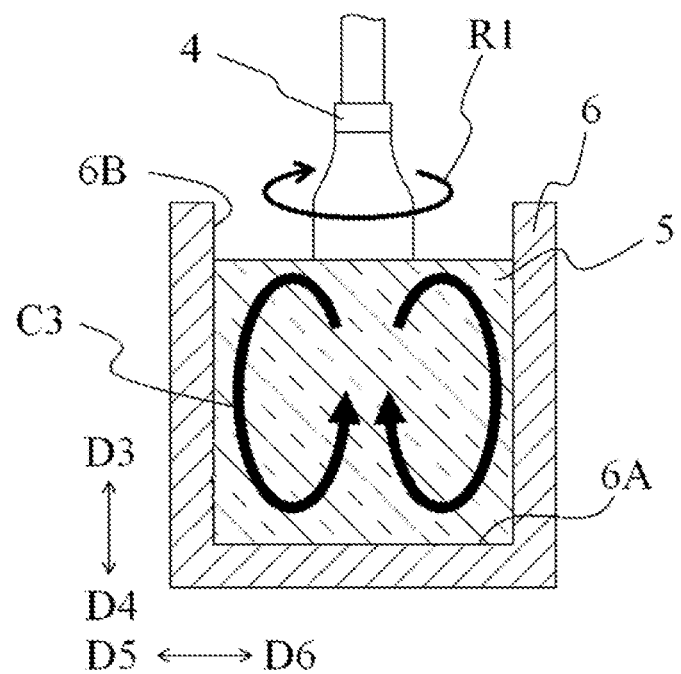
FIG. 6 is a schematic diagram showing a flow in a solution in a method for producing a crystal, according to an embodiment of the present invention, and is a magnified sectional view of the vicinity of the crucible and the seed crystal in the crystal production apparatus shown in FIG. 1.

In addition, as shown in FIG. 6, the upward convection C3 which moves toward the vicinity of the lower surface 4B of the seed crystal 4 becomes a convection which moves toward the inside wall surface 6B of the crucible 6, where the direction is changed by the lower surface 4B of the seed crystal 4. Consequently, although the temperature of the solution 5 in the vicinity of the seed crystal 4 is lower than the temperature of the solution 5 in the vicinity of the bottom 6A, a high-temperature solution 5 located in the vicinity of the bottom 6A of the crucible 6 can be carried to the vicinity of the surface by this convection. As a result, lowering of the surface temperature of the solution 5 can be suppressed.

Also, even in the case where miscellaneous crystals or seeds of miscellaneous crystals are generated and floated on the surface of the solution 5, these miscellaneous crystals can be moved away from the seed crystal 4, and adhesion or growth of miscellaneous crystals on the lower surface 4B, the side surface, or the upper surface 4A of the seed crystal 4 can be suppressed. That is, as shown in FIG. 6, the temperature of the solution 5 can be brought close to a uniform temperature (soaking) by generating the convection C3 in the solution 5.

In the previously known method for growing a crystal, the temperature in the vicinity of the surface is lowered because of radiation and vaporization of the solution and, thereby, the degree of supersaturation increases, so that miscellaneous crystals or seeds of miscellaneous crystals are generated in the vicinity of the surface of the solution easily and miscellaneous crystals adhere or grow around the seed crystal. As a result, it is difficult to improve the quality of a crystal grown on the lower surface of the seed crystal.

Modified Example 1 of Method for Producing Crystal

In the deceleration step to decelerate the rotation of the crucible 6, the rotation of the crucible 6 may be stopped.

That is, the rotation of the crucible 6 is decelerated and stopped while the seed crystal 4 is rotated. The rotation of the crucible 6 is decelerated by reducing the number of revolutions in a predetermined time and the rotation of the crucible 6 is stopped completely.

Specifically, as shown in FIG. 3, the number of revolutions of the crucible 6 is reduced over T2 to T3, and the rotation of the crucible 6 is stopped at T3. It is enough that the seed crystal 4 is rotated when the crucible 6 is stopped (at T3 shown in FIG. 3). Therefore, the seed crystal 4 may be rotated in the steady rotation state when the crucible 6 is stopped or be on the way to reduction in the number of revolutions. In the present embodiment, the seed crystal 4 is rotated in the steady rotation state when the crucible 6 is stopped.

The rotation of the crucible 6 is stopped while the lower surface 4B of the seed crystal 4 is in contact with the solution 5. It is enough that the lower surface 4B of the seed crystal 4 is in contact with the solution 5 and, for example, the whole seed crystal 4 may be immersed in the solution 5.

The rotation of the crucible 6 is stopped and, thereafter, the rotation of the seed crystal 4 is also stopped. Specifically, as shown in FIG. 3, the number of revolutions is reduced gradually over a predetermined time (from T4 to T5), and the seed crystal 4 is stopped completely at T5. The stop time T5 of the seed crystal 4 is set to become after the stop time T3 of the crucible 6.

Modified Example 2 of Method for Producing Crystal

Figure 7:
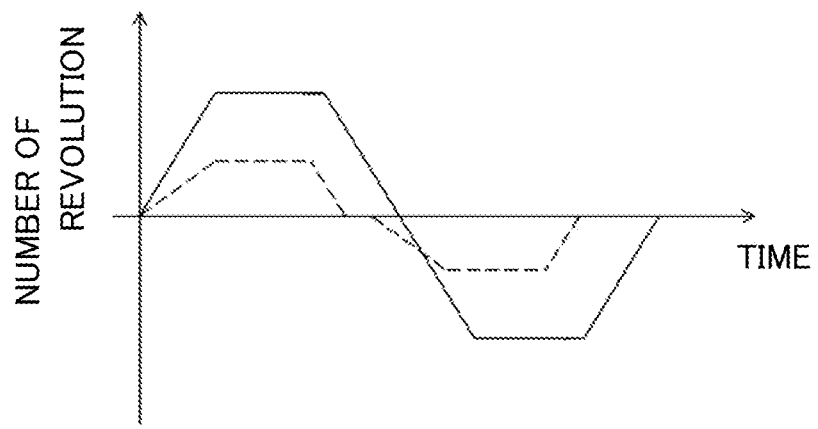
FIG. 7 is a diagram showing a rotation profile of a crucible and a seed crystal in a modified example of the method for producing a crystal, according to the present invention.

A step of rotating the crucible 6 again (crucible second rotation step) may be performed after the crucible rotation stop step. The crucible second rotation step may be performed again immediately after the crucible rotation stop step, or be performed after a lapse of a predetermined time. In the example shown in FIG. 7, after the crucible rotation stop step, rotation of the crucible 6 is started again after a lapse of a predetermined time. The "predetermined time" may be determined depending on the state of a convection in the solution 5 after the rotation of the crucible 6 is stopped. For example, the start may wait until the convection stops after the rotation of the crucible 6 is stopped. In this regard, FIG. 7 shows an outline of rotations of the crucible 6 and the seed crystal 4 as with FIG. 3. A broken line indicates changes in the number of revolutions of the crucible 6 with time, and a solid line indicates changes in the number of revolutions of the seed crystal 4 with time.

Figure 8:
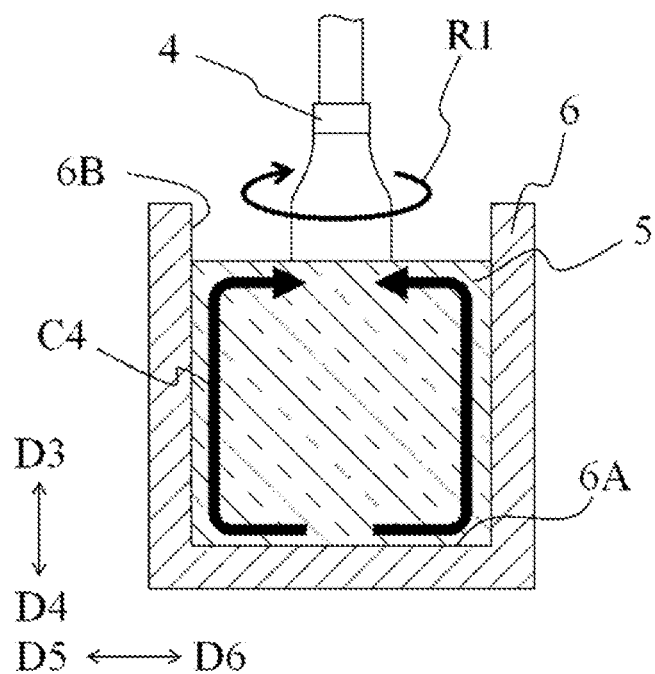
FIG. 8 is a schematic diagram showing a flow in a solution in a modified example of the method for producing a crystal, according to the present invention.

In the crucible second rotation step, when rotation of the crucible 6 is started and the rotation of the crucible 6 is accelerated, the solution 5 in the vicinity of the bottom 6A flows to the inside wall surface 6B side of the crucible 6 because of the centrifugal force. Consequently, as shown in FIG. 8, a convection C4 along the inside wall surface 6B of the crucible 6 is generated easily.

As described above, the crucible second rotation step is performed after the crucible rotation stop step and, thereby, a crystal can be grown easily in the vicinity of the end portions (end portions in D5, D6 directions) of the lower surface 4B of the seed crystal 4.

Figure 9:
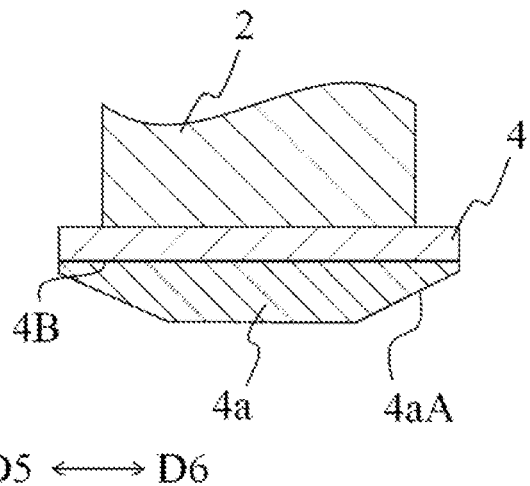
FIG. 9 is a schematic diagram showing a change in a crystal grown by the method for producing a crystal, shown in FIG. 8.
Figure 9:
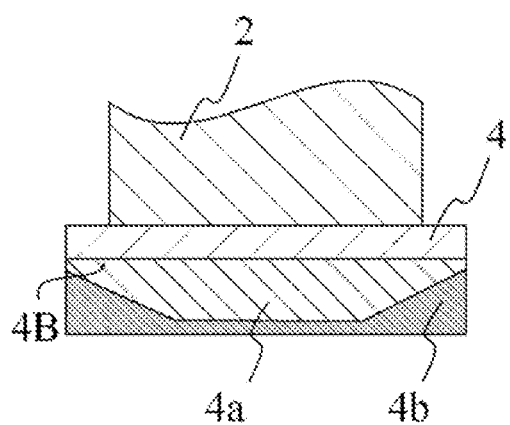

Specifically, for example, as shown in FIG. 9 (a), a crystal 4a, in which the film thickness in the vicinity of the center (center in D5, D6 directions) is large as compared with the film thicknesses of end portions (end portions in D5, D6 directions), is grown easily on the lower surface 4B of the seed crystal 4. Consequently, in the case where the crucible second rotation step is performed after the crucible rotation stop step, the convection C4 as shown in FIG. 8 is generated easily and, therefore, the convection C4 rich in carbon hits against an inclined surface 4aA of the crystal 4a easily. As a result, a crystal grows from the inclined surface 4aA of the crystal 4a easily, and as shown in FIG. 9 (b), a crystal 4b, in which the film thickness in the vicinity of the end portion of the crystal 4a is large, can grow easily.

The lower end surface of the crystal grown on the lower surface 4B of the seed crystal 4 can become flattened by combining a step in which a crystal grows easily in the vicinity of the center of the lower surface 4B and a step in which a crystal grows easily in the vicinity of the end portion of the crystal 4a, as described above. Consequently, an occurrence of bunching, e.g., a height difference, of the crystal grown on the lower surface 4B can be suppressed and the crystal can be grown while an occurrence of polymorphic variation or dislocation is suppressed. As a result, a long lengths of high-quality crystal can be grown.

In the above description, the case where the crucible second rotation step is performed after the crucible rotation stop step has been explained. However, in the case where the rotation of the crucible 6 is not stopped in the deceleration step, the crucible 6 may be accelerated in the rotation direction as the crucible second rotation step.

In the crucible second rotation step, rotation may be performed in the same direction as the original rotation direction, or rotation may be performed in the direction reverse to the original rotation direction (rotation direction of the crucible 6 in the crucible rotation step). This crucible second rotation step may be performed after the deceleration step or the crucible stop step, while the convection C3 is generated in the solution 5 or after the convection C3 is stopped.

In the case where the crucible 6 is rotated in the direction reverse to the original rotation direction, the convection C1" in the vicinity of the bottom 6A of the crucible 6 in the solution 5 can be made slower while the convection C3 is generated in the solution 5, so that the upward convection C1 can be made faster. As a result, the crystal growth rate and the like can be further improved.

Also, in the case where the crucible 6 is rotated in the direction reverse to the original rotation direction, carbon or silicon contained in the solution 5 in the crucible 6 can be mixed easily, so that the concentration distribution of carbon or silicon in the solution 5 can be made nearly steady and a crystal with reduced dislocation and the like can be grown. Meanwhile, the seed crystal 4 may remain rotated or be stopped once during the crucible second rotation step and thereafter.

In the crucible second rotation step, for example, the seed crystal 4 may be rotated in the direction reverse to the rotation direction of the crucible 6 before the rotation of the crucible 6 is started again. In this case, when the rotation of the crucible 6 is started again, the rotation direction of the convection C1" in the vicinity of the bottom 6A of the crucible 6 becomes reverse to the convection C1' in the vicinity of the center of the solution 5. Consequently, the convection C1" becomes faster than the convection C1' and, thereby, the convection C1 is generated. On the other hand, the seed crystal 4 is rotated, so that in the upper portion of the solution 5, the convection C2 which moves toward the outside (direction toward the inside wall surface 6B of the crucible 6) in the upper portion of the solution 5 is generated by the centrifugal force because of the rotation of the seed crystal 4.

As described above, the seed crystal 4 has been rotated when the rotation of the crucible 6 is started again and, thereby, the convection C1 and the convection C2 are combined in the solution 5, so that the upward convection C3 which moves toward the lower surface 4B of the seed crystal 4 can be generated.

Also, the crucible 6 is rotated in the direction reverse to the rotation direction of the seed crystal 4 and, thereby, the solution 5 is mixed easily, so that the concentration distributions of carbon and silicon can be improved. As a result, generation of dislocation or micropipe of the crystal grown on the lower surface 4B of the seed crystal 4 can be suppressed.

On the other hand, the rotation of the seed crystal 4 may be stopped after the crucible second rotation step is started. For example, when the rotation of the crucible 6 is started again, in the case where the crucible 6 is rotated in the direction reverse to the original rotation direction, the rotation direction of the seed crystal 4 may be changed to the same direction as the rotation direction of the crucible 6. In that case, the seed crystal 4 is stopped temporarily.

The rotation of the seed crystal 4 is stopped temporarily, so that in a region in which mixing is difficult when the seed crystal 4 is steady rotated, the flow is changed because of stop of the rotation and the whole solution 5 is mixed easily. Consequently, the concentration distribution of carbon or silicon in the solution 5 can be made steady. As a result, the concentration distributions of carbon and silicon of a crystal grown on the lower surface 4B of the seed crystal 4 can be improved, and generation of dislocation or micropipe can be suppressed.

Modified Example 3 of Method for Producing Crystal

Figure 10:
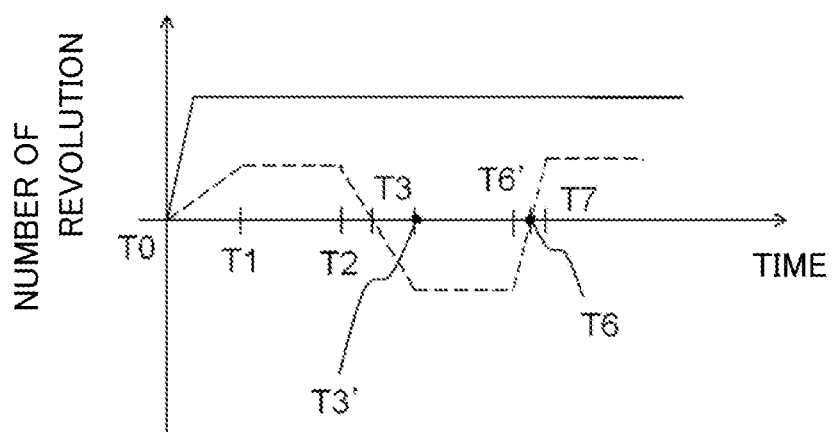
FIG. 10 is a diagram showing a rotation profile of a crucible and a seed crystal in a modified example of the method for producing a crystal, according to the present invention.

In the crucible second rotation step, the crucible 6 may be brought into the steady rotation state from the stop state in a time shorter than the time elapsed by the crucible 6 being brought into the stop state from the steady rotation state in the crucible stop step. That is, the convection C4 shown in FIG. 8 is generated favorably in a time shorter than the time in which the upward convection C3 is generated. An example of timing of rotations of the crucible 6 and seed crystal 4 is shown in FIG. 10. In this regard, the present modified example is the case where the seed crystal 4 is rotated steady. Also, FIG. 10 shows an outline of rotations of the crucible 6 and the seed crystal 4 as with FIG. 3. A broken line indicates changes in the number of revolutions of the crucible 6 with time, and a solid line indicates changes in the number of revolutions of the seed crystal 4 with time. Also, T0 to T7 indicate elapsed times.

Here, as for "the time elapsed by the crucible 6 being brought into the stop state from the steady rotation state in the deceleration step or the crucible stop step", for example, the time of from T2 to T3 shown in FIG. 10 may be employed. Also, as for "the time elapsed by the crucible 6 being brought into the steady rotation state from the stop state", for example, the time of from T6 to T7 shown in FIG. 10 may be employed.

Meanwhile, even when the crucible 6 is stopped in the crucible stop step, the convection C3 in the solution 5 is generated continuously. That is, the convection C3 in the solution 5 does not always stop at the same time with the stop of the rotation of the crucible 6. Therefore, as for "the time elapsed by the crucible 6 being brought into the stop state from the steady rotation state in the crucible stop step", for example, the time of from T2 to T3' may be employed in accordance with the state of the convection of the solution 5. Also, as for "the time elapsed by the crucible 6 being brought into the steady rotation state from the stop state", for example, the time of from T6' to T7 may be employed in accordance with the state of the convection of the solution 5.

In the case where the crucible second rotation step is performed, the convection C4, as shown in FIG. 8, is generated easily. Therefore, a silicon carbide crystal which usually grows easily in the lateral (perpendicular) direction with respect to the thickness direction grows further easily because of the convection C4. Consequently, the crystal can be flattened, as shown in FIG. 9 (b), by performing the crucible second rotation step in a time shorter than the time elapsed by the crucible 6 being brought into the stop state from the steady rotation state in the crucible stop step.

Modified Example 4 of Method for Producing Crystal

Figure 11:
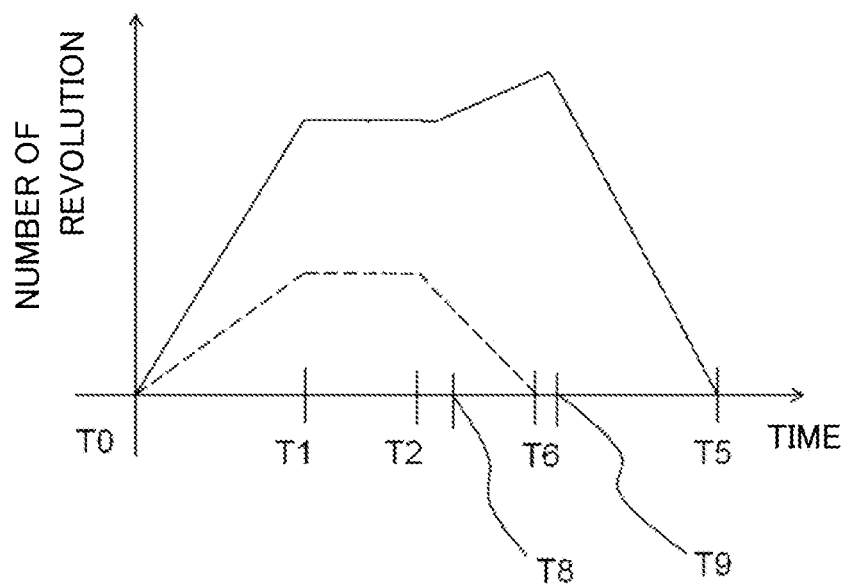
FIG. 11 is a diagram showing a rotation profile of a crucible and a seed crystal in a modified example of the method for producing a crystal, according to the present invention.

As shown in FIG. 11, in the crucible stop step, the rotation of the crucible 6 is brought into the stop state (T6), in which the rotation is stopped, from the steady rotation state (T2), in which a predetermined rotation is performed, in a time shorter than the time (from T0 to T1) elapsed by the crucible 6 being brought into the steady rotation state, in which a predetermined rotation is performed, from the stop state (TO), in which the rotation is stopped, in the crucible rotation step. The rotation of the crucible 6 is stopped in a short time and, thereby, the flow in the vicinity of the bottom 6A of the solution 5 is decelerated sharply relative to the convection C1'. As a result, the flow rate of the convection C1 in the solution 5 can be increased. Also, FIG. 11 shows an outline of rotations of the crucible 6 and the seed crystal 4 as with FIG. 3. A broken line indicates changes in the number of revolutions of the crucible 6 with time, and a solid line indicates changes in the number of revolutions of the seed crystal 4 with time. Also, T0 to T9 indicate elapsed times.

Meanwhile, a difference in the flow rate of the convection C1" in the solution 5 can be adjusted by adjusting the length of the stop time (from T2 to T6) of the crucible 6. As a result, the flow rate of the upward convection C3 which moves toward the lower surface 4B of the seed crystal 4 can be adjusted.

In addition, the flow rate of the convection C2 in the upper portion of the solution 5 generated on the basis of the centrifugal force because of the rotation of the seed crystal 4 can be adjusted by adjusting the number of revolutions of the seed crystal 4. According to this as well, the flow rate of the upward convection C3 which moves toward the lower surface 4B of the seed crystal 4 can be adjusted.

Also, as shown in FIG. 11, the rotation of the seed crystal 4 may be accelerated gradually in the stop time (from T2 to T6) of the crucible 6. Specifically, the number of revolutions of the seed crystal 4 may be increased (from T8 to T9) in the stop time (from T2 to T6) of the crucible 6. In the case where the rotation of the seed crystal 4 is accelerated in the stop time (from T2 to T6) of the crucible 6, as described above, the flow rate of the convection C2 generated in the upper portion of the solution 5 can be increased and the flow rate of the upward convection C3 which moves toward the lower surface 4B of the seed crystal 4 can be increased.

Modified Example 5 of Method for Producing Crystal

Figure 12:
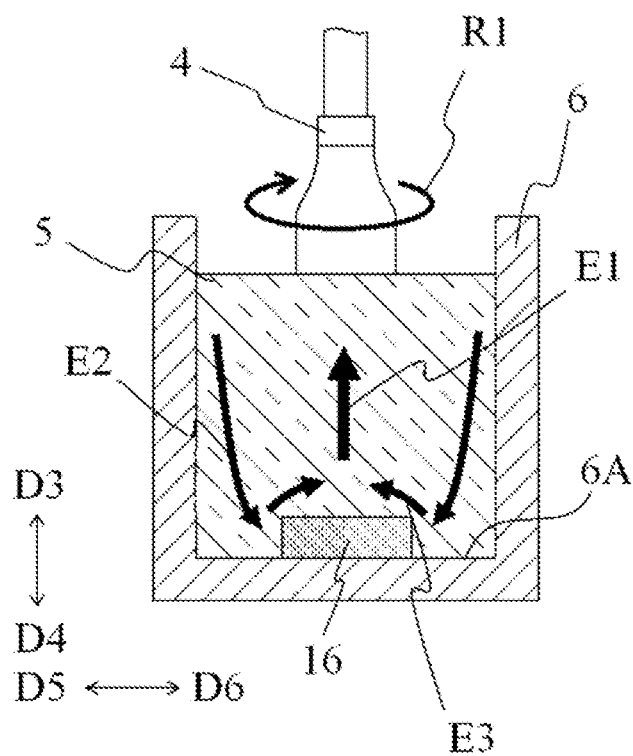
FIG. 12 is a schematic diagram showing a flow in a solution in a modified example of the method for producing a crystal, according to the present invention, and is a magnified sectional view of the vicinity of the crucible, the seed crystal, and a flow guide member in the crystal production apparatus shown in FIG. 1.

As shown in FIG. 12, a flow guide member 16 may be fixed and arranged on the bottom 6A in the crucible 6 before the step to bring the seed crystal 4 into contact with the solution 5.

A material having a melting point higher than that of the solution 5 can be used for the flow guide member 16. Specifically, the flow guide member 16 can be formed from, for example, the same material as that for the crucible 6. In the case where the flow guide member 16 is formed from the same material as that for the crucible 6, the flow guide member 16 can be formed integrally in working of the crucible 6 and, therefore, good productivity can be exhibited. Meanwhile, a material having a melting point higher than that of the solution 5 is suitable for the flow guide member 16 and, for example, yttrium oxide, zirconium oxide, magnesium oxide, calcium oxide, or the like can be used.

The flow guide member 16 may be formed integrally with the crucible 6 or be fixed and arranged on the bottom 6A of the crucible 6 afterward. In the case where the flow guide member 16 is arranged on the bottom 6A of the crucible 6 afterward, the location of the flow guide member 16 can be changed easily and, therefore, the degree of flexibility of design can be increased.

As for the method for fixing the flow guide member 16 to the bottom 6A, for example, a method in which fixing is performed by an adhesive capable of maintaining adhesion even in the solution 6 can be employed. An adhesive containing a material having a melting point higher than that of the solution 5 can be used as the adhesive and, for example, a carbon adhesive, a ceramic adhesive containing a ceramic material, e.g., alumina or zirconium, can be used. As described above, the flow guide member 16 is fixed and arranged on the bottom 6A of the crucible 6 and, thereby, the flow guide member 16 is in the shape of a protrusion from the bottom 6A of the crucible 6.

As for the flow guide member 16, for example, a polygonal shape, e.g., a tetragonal shape, or a three-dimensional shape, e.g., a pyramid, a truncated pyramid, a circular column, a circular cone, or a circular truncated cone, can be employed. The bottom of the flow guide member 16 having the above-described shape is fixed to the bottom 6A of the crucible 6. The height of the flow guide member 16 is set in such a way that the location of the upper end portion of the flow guide member 16 is apart from the lower surface 4B of the seed crystal 4. The height from the bottom to the upper end portion of the flow guide member 16 can be set to become, for example, less than or equal to one-half the height from the bottom 6A of the crucible 6 to the liquid surface of the solution 5.

Figure 13:
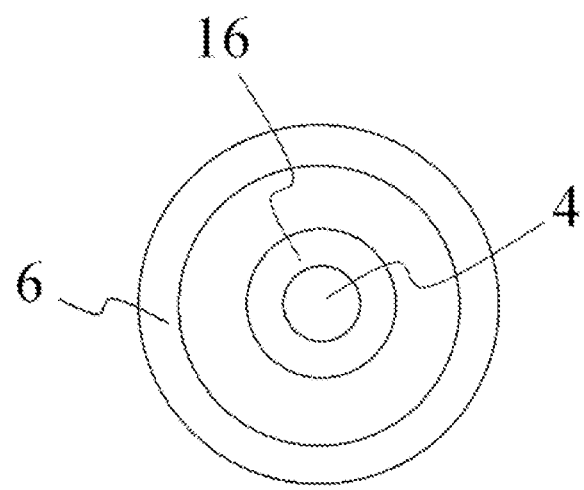
FIG. 13 is a plan view of a crystal production apparatus shown in FIG. 12, when viewed from above (D3 direction).

As shown in FIG. 13, the flow guide member 16 is arranged at a location overlapping the seed crystal 4 in the bottom 6A in such a way as to have the shape of a protrusion from the bottom 6A. It is enough that at least part of the flow guide member 16 is arranged to overlap the seed crystal 4. As shown in FIG. 12, the flow guide member 16 is arranged in such a manner and, therefore, an upward convection E1 which moves toward the lower surface 4B of the seed crystal 4 can be generated in the solution 5 easily. This will be described below in detail with reference to FIG. 14.

Figure 14:
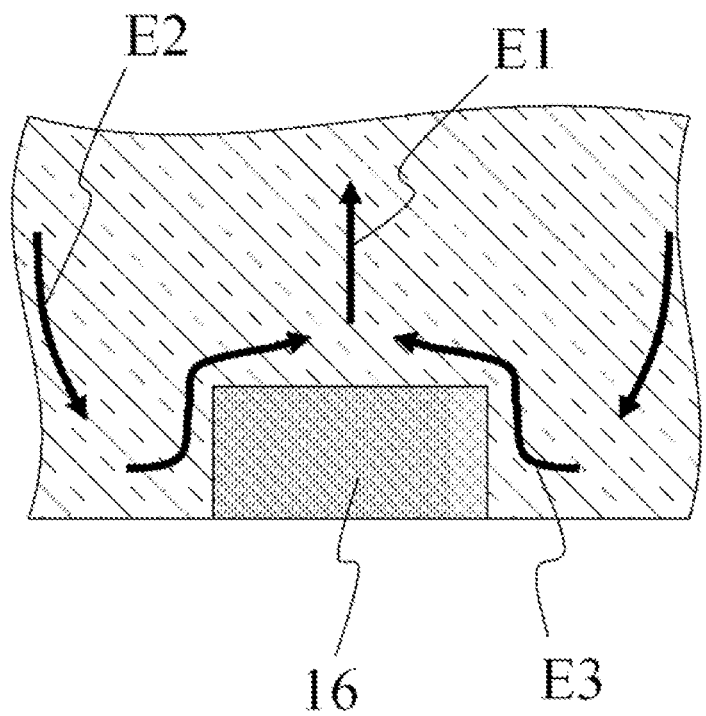
FIG. 14 is a further magnified diagram of part of the crystal production apparatus shown in FIG. 12 and is a magnified sectional view showing part of the solution and the flow guide member.

As shown in FIG. 14, a side-surface convection E2 along the inside wall surface 6B of the crucible 6 becomes a bottom convection E3 along the bottom 6A, and when the resulting bottom convections E3 overlap one another in the vicinity of the rotation center of the bottom 6A, the bottom convection E3 moves along the outer circumference of the flow guide member 16 because the flow guide member 16 is arranged and moves upward (D3 direction) easily. Consequently, the bottom convection E3 above the flow guide member 16 has a vector which moves upward (D3 direction) larger than a vector which moves laterally (D5, D6 directions), and when overlapping occurs, cancelling out in the lateral direction can become difficult. As a result, the upward convection E1 which moves toward the lower surface 4B of the seed crystal 4 can be increased and the growth rate of a crystal grown on the lower surface 4B of the seed crystal 4 can be improved.

Meanwhile, in the case where the flow guide member 16 is made from carbon as with the crucible 6, the bottom convection E3 flows along the flow guide member 16 and, thereby, carbon is supplied from the flow guide member 16 to the bottom convection E3, so that the upward convection E1 which moves toward the lower surface 4B of the seed crystal 4 can be brought into a carbon-rich state. As a result, the crystallinity of the crystal grown on the lower surface 4B of the seed crystal 4 can be improved.

Figure 15:
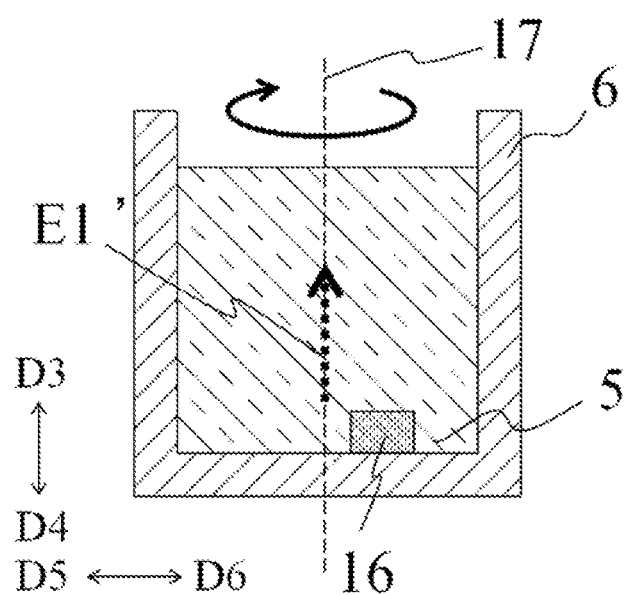
FIG. 15 is a diagram related to a modified example of a method for producing a crystal, according to the present invention, (a) is a magnified sectional view showing the solution and the vicinity of a flow guide member, and (b) is a plan view when viewed from above (D3 direction).
Figure 15:
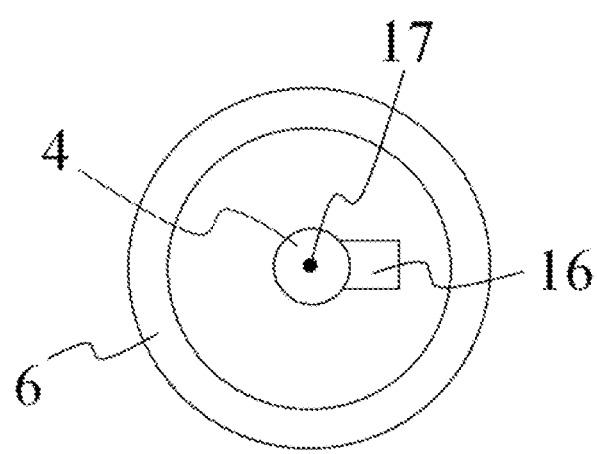

On the other hand, as shown in FIG. 15, the flow guide member 16 may be arranged in such a way as not to overlap the rotation center 17 serving as the center of rotation when the crucible 6 is rotated. The rotation center 17 is synonymous with the rotation axis when the crucible 6 is rotated. In the case where the flow guide member 16 is arranged in such a manner, as shown in FIG. 15, an upward convection E1' which moves toward the lower surface 4B of the seed crystal 4 can be further generated from the vicinity of the rotation center 17 and, in addition, the solution 5 can be mixed. In this regard, a dotted line arrow shown in FIG. 15 schematically indicates the upward convection E1' generated when the crucible 6 is rotated.

As described above, the solution 5 can be mixed and, thereby, for example, a stagnant place not mixed by the convection (E1, E2, or E3) generated in the solution 5 is mixed easily, so that variations in concentration distribution of the whole solution 5 can be suppressed. Consequently, variations in composition of a crystal grown on the lower surface 4B of the seed crystal 4 can be suppressed.

Figure 16:
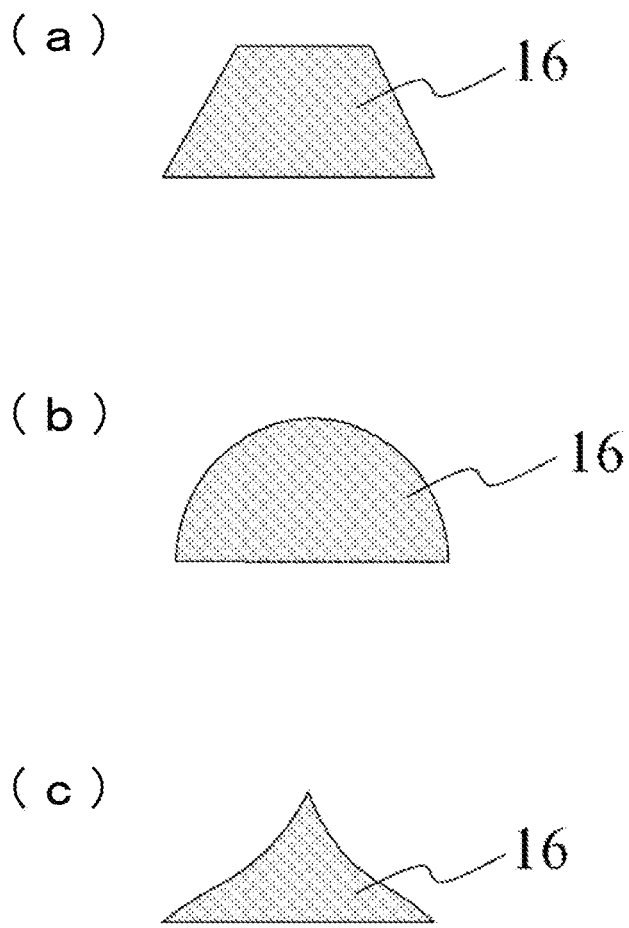
FIG. 16 shows diagrams of modified examples of the method for producing a crystal, shown in FIG. 12, and each diagram shows a sectional view of a flow guide member cut in the thickness direction.

Meanwhile, as shown in FIG. 16, the cross-sectional area of the flow guide member 16 in the direction perpendicular to the thickness direction may decrease with increasing proximity to the end. Specifically, as shown in FIG. 16, the shape of a circular truncated cone shown in (a), the shape of a semicircle shown in (b), or the shape of a circular cone shown in (c) can be employed for the flow guide member 16. In this regard, FIG. 16 shows sectional views cut in the direction parallel to the thickness direction.

In the case where the flow guide member 16 has the shape of a circular truncated cone (FIG. 16 (a)), the side surface is inclined at an acute angle relative to the bottom, so that the bottom convection E3 can move upward easily. Also, in the case where the flow guide member 16 has the shape of a semicircle (FIG. 16 (b)), bottom convections E3 can smoothly move upward and overlap one another in the upper portion easily. Also, in the case where the flow guide member 16 has the shape of a circular cone (FIG. 16 (c)), the end is thin, so that the bottom convections E3 move upward along the side surface and, thereafter, overlap one another in a state in which movement in the lateral direction is reduced. Therefore, cancelling out of the bottom convections E3 in the lateral direction can be suppressed.

The shape of the flow guide member 16 is changed in such a manner and, thereby, cancelling out of the bottom convections E3 in the lateral direction becomes further difficult, so that the upward convection E1 which moves upward can be further increased. As a result, the growth rate of a crystal grown on the lower surface 4B of the seed crystal 4 can be increased.

Modified Example 6 of Method for Producing Crystal

Figure 17:
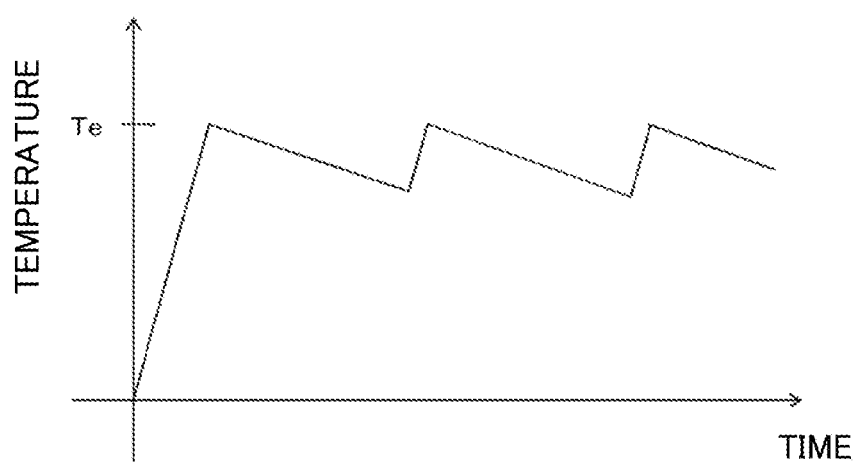
FIG. 17 is a diagram showing a profile of the elapsed time and the solution temperature in a modified example of the method for producing a crystal, according to the present invention.

As shown in FIG. 17, the temperature of the solution 5 may be changed with a lapse of time during growth of the crystal. Specifically, as shown in FIG. 17, when a crystal is grown by bringing the lower surface 4B of the seed crystal 4 into contact with the solution 5, after a lapse of a predetermined time, the temperature of the solution 5 is raised to increase the solubility of the solution 5. In this regard, in FIG. 17, the horizontal axis indicates the elapsed time, and the vertical axis indicates the temperature of the solution 5.

A raised temperature Te is favorably set at a temperature lower than the boiling point of silicon. Therefore, The raised temperature Te can be set at, for example, 2,100° C. or higher and 2,300° C. or lower. The timing to reach the raised temperature Te can be set in such a way that the interval of the raised temperature Te becomes, for example, 4 hours or more and 10 hours or less.

In the case where a crystal is grown on the lower surface 4B of the seed crystal 4, miscellaneous crystals may become large and granular in the solution 5. However, the solubility of the solution 5 can be increased by raising the temperature of the solution 5 to the raised temperature Te on the way to growth, and granular miscellaneous crystals can be dissolved. Consequently, it is possible that granular miscellaneous crystals do not adhere to the vicinity of the seed crystal 4 and, as a result, the crystal can grow over a long period of time.

Also, in the example shown in FIG. 17, the temperature is raised and, thereafter, the temperature is lowered gradually with a lapse of time. When a crystal is grown, the carbon concentration in the solution 5 decreases with a lapse of time. Consequently, the solubility of the solution 5 can be reduced by lowering the temperature with a lapse of time, and reduction in crystal growth rate can be suppressed.

Figure 18:
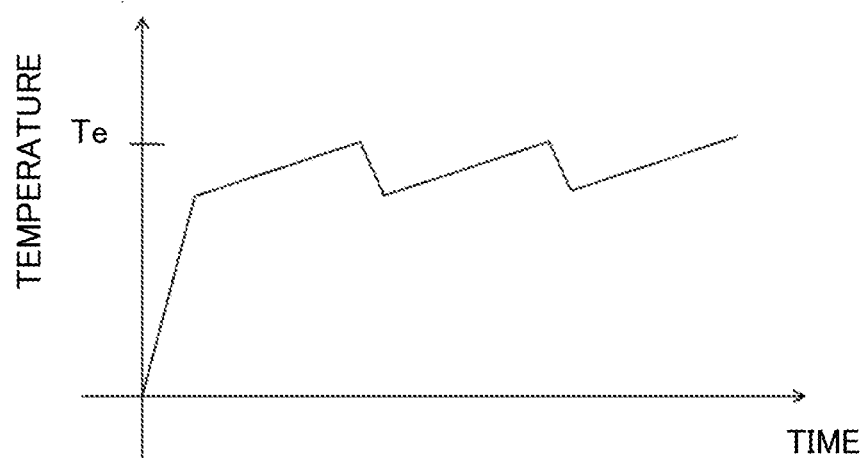
FIG. 18 is a diagram showing a profile of the elapsed time and the solution temperature in a modified example of the method for producing a crystal, according to the present invention.

On the other hand, as shown in FIG. 18, the temperature may be raised gradually to the raised temperature Te, at which the solubility of the solution 5 is high, with a lapse of time. It is possible that granular miscellaneous crystals are not formed easily by allowing the solubility to become high with a lapse of time, as described above. Consequently, the crystal can grow over a long period of time. In this regard, in FIG. 18, the horizontal axis indicates the elapsed time, and the vertical axis indicates the temperature of the solution 5.

The invention claimed is:

1. A method for producing a crystal, where a lower surface of a seed crystal which is rotatably arranged and made of silicon carbide is brought into contact with a solution of silicon solvent containing carbon in a crucible which is rotatably arranged and the seed crystal is pulled up and a crystal of silicon carbide is grown from the solution on the lower surface of the seed crystal, comprising:
   bringing the lower surface of the seed crystal into contact with the solution;
   rotating the seed crystal;
   rotating the crucible; and
   stopping the rotating of the crucible before the rotating of the seed crystal stops and while the lower surface of the seed crystal is in contact with the solution.

2. The method for producing a crystal according to claim 1, further comprising rotating the crucible again after the stopping of the rotating of the crucible.

3. The method for producing a crystal according to claim 2, further comprising continuing the rotating of the seed crystal during a period from the stopping of the rotating of the crucible to the start of the rotating of the crucible again.

4. The method for producing a crystal according to claim 3, wherein during the continuing of the rotating of the seed crystal, the rotation of the seed crystal is steady.

5. The method for producing a crystal according to claim 1, further comprising stopping the rotation of the seed crystal after stopping the the rotating of the crucible.

6. The method for producing a crystal according to claim 1, wherein the rotating of the seed crystal is in a first rotational direction, the method further comprising rotating the seed crystal in a second rotational direction opposite the first rotational direction after stopping the rotating of the seed crystal and stopping the rotating of the crucible.

* * * * *